(12) United States Patent
Yang

(10) Patent No.: US 10,229,976 B2
(45) Date of Patent: Mar. 12, 2019

(54) COMPOUND SEMICONDUCTOR FILM STRUCTURE

(71) Applicant: Lextar Electronics Corporation, Hsinchu (TW)

(72) Inventor: Chung-Chieh Yang, Taiching (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 15 days.

(21) Appl. No.: 15/262,306

(22) Filed: Sep. 12, 2016

(65) Prior Publication Data
US 2017/0117368 A1    Apr. 27, 2017

(30) Foreign Application Priority Data
Oct. 22, 2015 (TW) ............................. 104134646 A

(51) Int. Cl.
*H01L 29/20* (2006.01)
*H01L 21/306* (2006.01)
(Continued)

(52) U.S. Cl.
CPC ...... *H01L 29/2003* (2013.01); *H01L 21/0242* (2013.01); *H01L 21/0243* (2013.01);
(Continued)

(58) Field of Classification Search
CPC ............... H01L 29/2003; H01L 29/205; H01L 29/0692; H01L 21/30612; H01L 21/0254;
(Continued)

(56) References Cited

U.S. PATENT DOCUMENTS 7,491,984 B2    2/2009  Koike et al.
8,659,031 B2    2/2014  Kim
(Continued)

FOREIGN PATENT DOCUMENTS

GB    2488587 A    9/2012
JP    2002293698 A   10/2002
(Continued)

OTHER PUBLICATIONS

TW Office Action dated May 12, 2016 in corresponding Taiwan application (No. 104134646).
(Continued)

*Primary Examiner* — Moazzam Hossain
*Assistant Examiner* — Stanetta D Isaac
(74) *Attorney, Agent, or Firm* — McClure, Qualey & Rodack, LLP

(57) ABSTRACT

A compound semiconductor film structure includes a substrate, a first compound semiconductor epitaxial layer and a second compound semiconductor epitaxial layer. The substrate has a top surface. The first compound semiconductor epitaxial layer is formed on the top surface and has an epitaxial interface and at least one recess, wherein the epitaxial interface is disposed on one side of the first compound semiconductor epitaxial layer opposite to the side of the first compound semiconductor epitaxial layer facing the top surface, and the at least one recess is formed in the first compound semiconductor epitaxial layer. The second compound semiconductor epitaxial layer formed on the epitaxial interface. The top surface and the bottom of recess are separated by a distance substantially ranging between 0.8 μm and 1.3 μm.

11 Claims, 3 Drawing Sheets

(51) Int. Cl.
  *H01L 21/02* (2006.01)
  *H01L 29/06* (2006.01)
  *H01L 29/205* (2006.01)

(52) U.S. Cl.
  CPC .... *H01L 21/0254* (2013.01); *H01L 21/02458* (2013.01); *H01L 21/02494* (2013.01); *H01L 21/02502* (2013.01); *H01L 21/02647* (2013.01); *H01L 21/30612* (2013.01); *H01L 29/0692* (2013.01); *H01L 29/205* (2013.01); *H01L 21/0265* (2013.01)

(58) Field of Classification Search
  CPC ......... H01L 21/02647; H01L 21/02458; H01L 45/148; H01L 2924/1026; H01L 2924/10323; H01L 2924/10341; H01L 2924/10344
  See application file for complete search history.

(56) References Cited

U.S. PATENT DOCUMENTS

| | | | |
|---|---|---|---|
| 9,034,739 B2 | 5/2015 | Wang | |
| 2010/0099213 A1 | 4/2010 | Wu et al. | |
| 2011/0204378 A1* | 8/2011 | Su | H01L 21/0242 257/76 |
| 2012/0258286 A1* | 10/2012 | Amano | C30B 25/186 428/162 |
| 2014/0264415 A1* | 9/2014 | Okuno | H01L 33/22 257/98 |
| 2015/0280058 A1 | 10/2015 | Kappers et al. | |

FOREIGN PATENT DOCUMENTS

| | | |
|---|---|---|
| JP | 2011-134948 A | 7/2011 |
| JP | 2001-345281 A | 12/2011 |
| JP | 2014-509781 A | 4/2014 |
| TW | 201203322 A1 | 1/2012 |

OTHER PUBLICATIONS

Hirayama, et al.: "Milliwatt power 270 nm-band AlGaN deep-UV LEDs fabricated on ELO-AlN templates"; hys. Status Solidi C 6, No. S2, S474-S477 (2009) / DOI 10.1002/pssc.200880959; pp. 1-4.

EP Search Report dated Feb. 24, 2017 in European application (No. 16194832.8-1552).

JPO Office Action dated Mar. 6, 2018 in JP application (No. 2016196308).

Japanese language office action dated Sep. 29, 2017, issued in application No. JP 2016-196308, and its English language translation.

* cited by examiner

303

303

COMPOUND SEMICONDUCTOR FILM STRUCTURE

This application claims the benefit of Taiwan application Serial No. 104134646, filed Oct. 22, 2015, the disclosure of which is incorporated by reference herein in its entirety.

TECHNICAL FIELD

The disclosure relates in general to a semiconductor film structure, and more particularly to a compound semiconductor film structure.

BACKGROUND

The III-V nitride-based compound semiconductor composed of 3B elements containing aluminum (Al), gallium (Ga) or indium (In) and 5B elements containing nitrogen (N) has a wide energy gap and can be used for manufacturing electronic components such as semiconductor laser diodes (LD), light emitting diodes (LED), detectors, and high frequency and high power transistors.

Currently, other than sapphire substrates and silicon substrates, a substrate more suitable for epitaxy growth of the III-V nitride-based compound semiconductor layer is still not available, a large lattice mismatch may occur between the III-V nitride-based compound semiconductor layer and the sapphire substrate or the silicon substrate, and this may cause dislocation to the epitaxial layer and deteriorate the performance of device using the semiconductor film structure. To improve the quality of the semiconductor film structure and decrease dislocation density there between, various technologies for improving the quality of epitaxial growth, such as low temperature buffer layer technology, layer insertion technology, and epitaxial laterally overgrowth (ELO) technology, are provided.

The conventional low temperature buffer layer technology and layer insertion technology both are characterized by the following steps. Firstly, a low temperature epitaxy growth is performed to form a low temperature buffer layer which is subsequently annealed at a high temperature, such that the low temperature buffer layer can have a lower nucleation density. Then, a second stage of high temperature epitaxy growth is performed on the annealed buffer layer. Although the nucleation density of the epitaxial layer can be largely reduced by these approaches, the epitaxial structure of the epitaxial layer still has a large dislocation density. As for the ELO technology, regular holes or protrusions should be firstly formed on the epitaxial growth surface using by etching process in order to block the lattice defects extending upwards during the subsequent epitaxy growth process. Relatively complicated manufacturing process is required. Furthermore, the critical dimension and the process window of the mask used in the ELO technology are micrometer scaled. Besides the ELO technology requires longer manufacturing time and higher manufacturing cost. Therefore the applying the ELO technology to form an epitaxial structure with a large area can be rather costly.

Therefore, it has become a prominent task to provide an advanced compound semiconductor film structure to resolve the problems encountered in prior art.

SUMMARY

According to one embodiment, a compound semiconductor film structure is provided. The compound semiconductor film structure includes a substrate, a first compound semiconductor epitaxial layer and a second compound semiconductor epitaxial layer. The substrate has a top surface. The first compound semiconductor epitaxial layer is formed on the top surface and has an epitaxial interface and at least one recess, wherein the epitaxial interface is disposed on one side of the first compound semiconductor epitaxial layer opposite to the side of the first compound semiconductor epitaxial layer facing the top surface, and the at least one recess is formed in the first compound semiconductor epitaxial layer. The second compound semiconductor epitaxial layer formed on the epitaxial interface. The top surface and the bottom of recess are separated by a distance substantially ranging between 0.8 micrometers (µm) and 1.3 µm.

According to the above embodiment of the present disclosure, a compound semiconductor film structure is provided. A first compound semiconductor film whose thickness substantially ranges between 1 µm and 1.5 µm is formed on a top surface of a substrate by an epitaxial growth technology, wherein the compound semiconductor film has a plurality of regularly arranged island structures separated by a plurality of recesses. Then, a second compound semiconductor film is formed on the island structures and covers the recess to form a compound semiconductor film structure having a plurality of irregularly arranged gaps (recesses), wherein the top surface of the substrate and the bottom of the recesses are separated by a distance substantially ranging between 0.8 µm and 1.3 µm.

Because the gaps (recesses) can block the lattice defects extending upwards in the epitaxy process, the dislocation density of the second compound semiconductor epitaxial layer thus can be reduced and the quality of the compound semiconductor film structure can be improved. In addition, a self-assembled compound semiconductor film structure can be formed on the substrate by merely using an epitaxial growth process, additional etching process used to form regular holes or protrusions on the substrate required by the ELO technology can be omitted, the process for fabricating the compound semiconductor film structure can be simplified and the manufacturing cost can be reduced accordingly.

The above and other aspects of the present disclosure will become better understood with regard to the following detailed description of the preferred but non-limiting embodiment(s). The following description is made with reference to the accompanying drawings.

DETAILED DESCRIPTION

The disclosure provides a compound semiconductor film structure capable of resolving the problems resulted from high dislocation density and lattice defects of the conventional III-V nitride-based compound semiconductor epitaxy film and at the same time simplifying the manufacturing process and reducing the manufacturing cost. For the object, technical features and advantages of the present invention to be more easily understood by anyone ordinary skilled in the technology field, a number of exemplary embodiments based on the compound semiconductor film structure and the manufacturing method thereof are disclosed below with detailed descriptions and accompanying drawings.

It should be noted that these embodiments are for exemplification purpose only, not for limiting the scope of protection of the invention. The invention can be implemented by using other features, elements, methods and parameters. The preferred embodiments are merely for illustrating the technical features of the invention, not for limiting the scope of protection of. Anyone skilled in the technology field of the invention will be able to make suitable modifications or changes based on the specification disclosed below without breaching the spirit of the invention. Designations common to the accompanying drawings are used to indicate identical or similar elements.

Figure 1A:
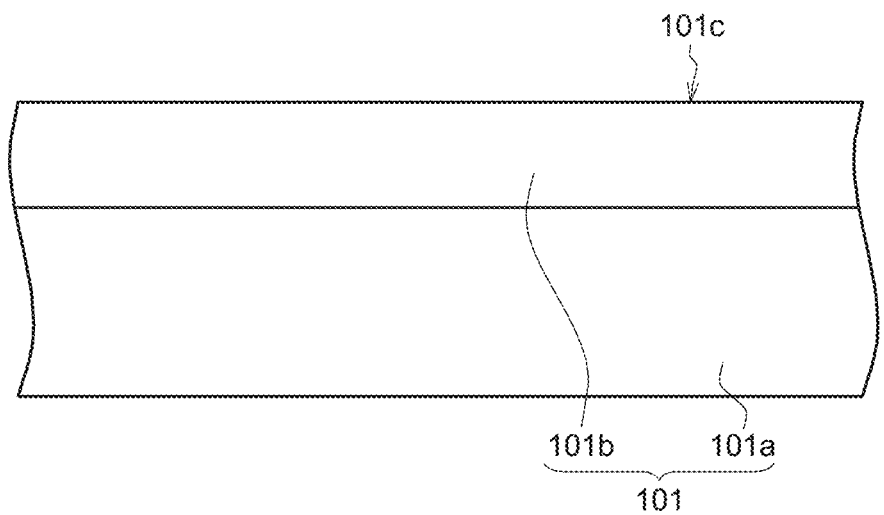
FIGS. 1A to 1C are cross-sectional views illustrating the process structures for forming a compound semiconductor film structure according to an embodiment of the present disclosure.
Figure 1B:
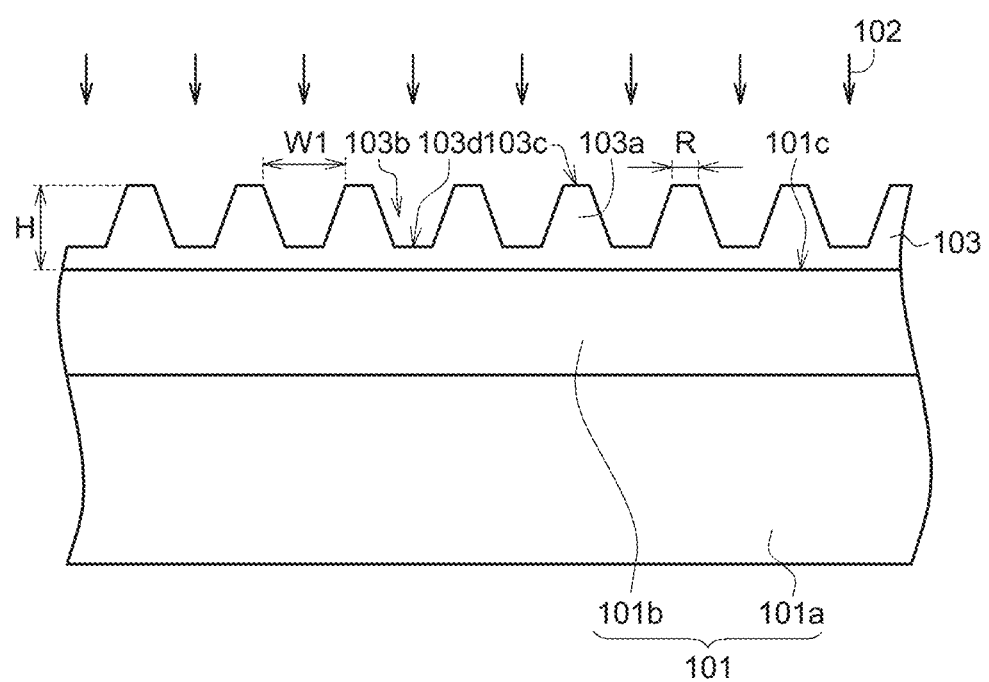
Figure 1C:
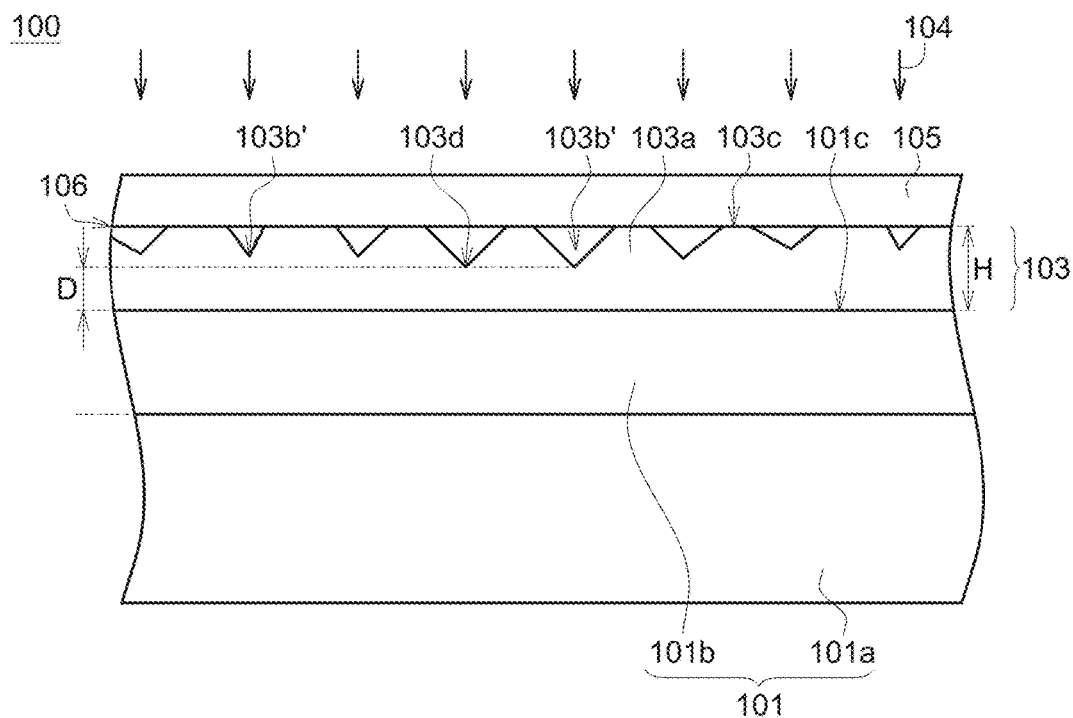

FIGS. 1A to 1C are sectional views illustrating the process structures for forming a compound semiconductor film structure 100 according to an embodiment of the present disclosure. The method for manufacturing the compound semiconductor film structure 100 includes following steps: Firstly, a substrate 101 is provided (as indicated in FIG. 1A). In some embodiments of the present disclosure, the substrate 101 can be realized by a sapphire substrate, a semiconductor substrate, a ceramic substrate or a plastic substrate. In some other embodiments of the present disclosure, the substrate 101 can be realized by a semiconductor precursor layer 101*b* disposed on a base board, such as a sapphire substrate, a semiconductor the substrate, a ceramic substrate or a plastic substrate. In the present embodiment, the substrate 101 can be realized by an aluminum nitride (AlN) precursor layer 101*b* disposed on the sapphire substrate 101*a*.

Then, a first epitaxial growth process 102 is performed on the top surface 101*c* of the substrate 101 (the AlN precursor layer 101*b*) to form a first compound semiconductor epitaxial layer 103 (as indicated in FIG. 1B).

In some embodiments of the present disclosure, the first compound semiconductor epitaxial layer 103 includes an aluminum containing semiconductor material selected from a group consisting of aluminum nitride (AlN), aluminum gallium nitride (AlGaN), aluminum indium gallium nitride (AlInGaN) and the arbitrary combinations thereof. In the present embodiment, the first compound semiconductor epitaxial layer 103 preferably is realized by an AlN epitaxial layer.

Figure 2:
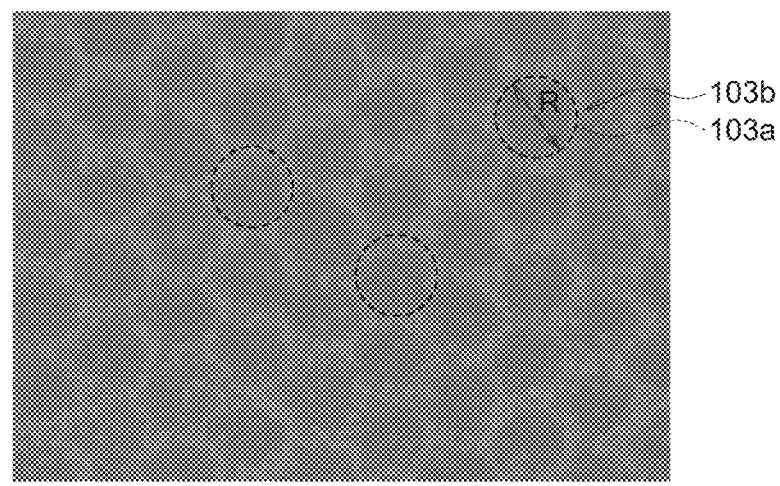
FIG. 2 is an electron microscopy image of the first compound semiconductor epitaxial layer as depicted in FIG. 1B, wherein the image is captured using a scanning electron microscope (SEM)

Referring to FIG. 2, FIG. 2 is an electron microscopy image of the first compound semiconductor epitaxial layer 103 as depicted in FIG. 1B, wherein the image is captured using an SEM. The AlN epitaxial layer (the first compound semiconductor epitaxial layer 103) formed by the first epitaxial growth process 102 has a plurality of regularly arranged hexagonal island structures 103*a*. Each island structure 103*a* has a diameter R substantially ranging between 2 μm and 4 μm. As indicated in FIG. 2, the first compound semiconductor epitaxial layer 103 has a honeycomb shaped profile taken from the top view of the electron microscopy image.

In details, the first compound semiconductor epitaxial layer 103 has a plurality of recesses 103*b* used to divide the first compound semiconductor epitaxial layer 103 into a plurality of regularly arranged hexagonal island structures 103*a*. Each recess 103*b* has a cross-sectional profile wider at the top but narrower at the bottom and an opening width W1 substantially ranging between 0.1 μm and 0.5 μm. The recesses 103*b* can be put together to form a pattern and the first compound semiconductor epitaxial layer 103 can be divided into a plurality of regularly arranged hexagonal conical island structures 103*a* by the pattern (as indicated in FIG. 1B).

Furthermore, each island structure 103*a* of the first compound semiconductor epitaxial layer 103 has a substantially flat top 103*c*. In the present embodiment, the top 103*c* of each island structure 103*a* is a surface substantially parallel to a c-plane of the AlN epitaxial layer. It should be noted that, the context that each island structure 103*a* of the first compound semiconductor epitaxial layer 103 has a substantially flat top 103*c* only when the thickness H of the first compound semiconductor epitaxial layer 103 is satisfied certain conditions. In some embodiments of the present disclosure, the thickness H of the first compound semiconductor epitaxial layer 103 must be restricted within the range between 1 μm and 1.5 μm. If the thickness H of the first compound semiconductor epitaxial layer 103 is too large or too small, each island structure 103*a* cannot have a substantially flat top 103*c*.

Figure 3A:
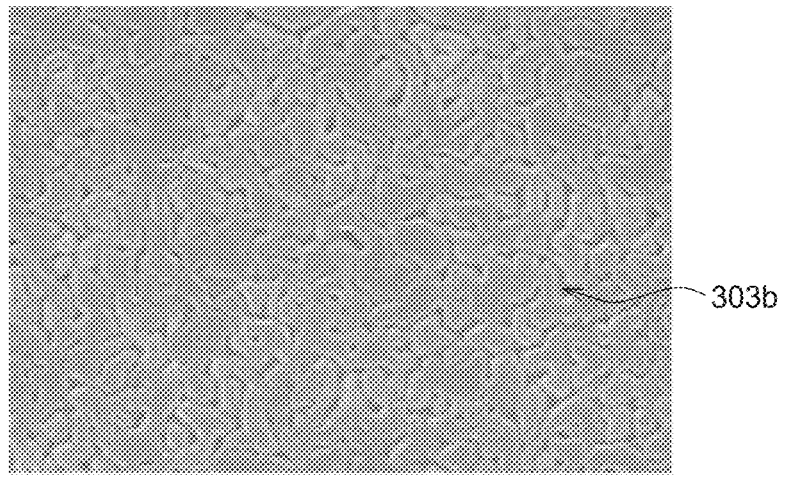
FIGS. 3A and 3B are electron microscopy images of a first compound semiconductor epitaxial layer respectively taken at the time while the growth thickness is substantially smaller than 1 µm and greater than 1.5 µm, wherein the images are captured using an SEM.
Figure 3B:
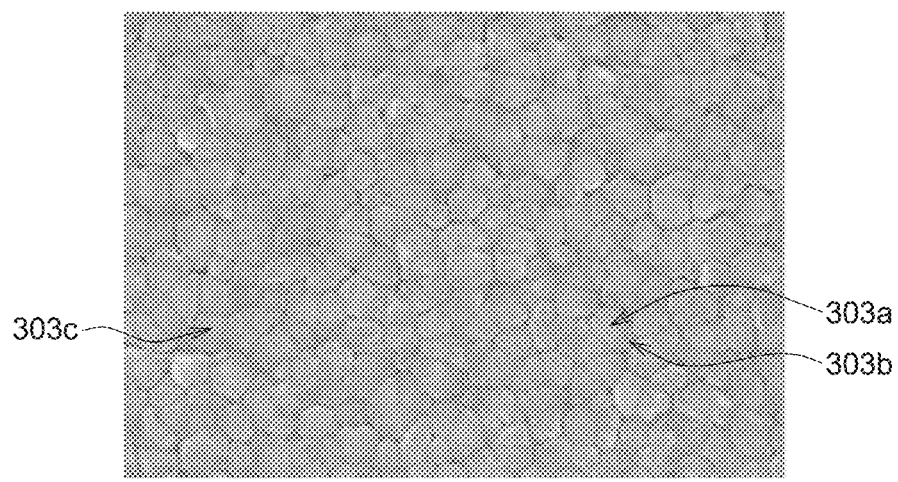

Referring to FIG. 3A and FIG. 3B, FIG. 3A and FIG. 3B are electron microscopy images of a first compound semiconductor epitaxial layer 303 respectively taken at the time while the growth thickness is substantially smaller than 1 μm and greater than 1.5 μm, wherein the images are captured using an SEM. As indicated in FIG. 3A, when the growth thickness of the first compound semiconductor epitaxial layer 303 is substantially smaller than 1 μm, the recess 303*b* formed in the first compound semiconductor epitaxial layer 303 are still irregular cracks that cannot put together to form a pattern to divide the first compound semiconductor epitaxial layer 303 into a plurality of regularly arranged hexagonal conical island structures (as indicated in FIG. 2).

As indicated in FIG. 3B, when the growth thickness of the first compound semiconductor epitaxial layer 303 is substantially greater than 1.5 μm, it can be determined that the top 303*c* of the hexagonal conical island structure 303*a* of the first compound semiconductor epitaxial layer 303 has irregularly distributed shadows. In other words, each top 303*c* of the hexagonal conical island structures 303*a* is no more a flat surface parallel to the same lattice direction of the AlN epitaxial layer; and the fact can be proved by the measurement of the X-ray reflectance of the top 303*c* of the hexagonal conical island structures 303*a*.

Then, a second epitaxial growth process 104 is performed to form a second compound semiconductor epitaxial layer 105 on the first compound semiconductor epitaxial layer 103, such that the compound semiconductor film structure 100 as shown in FIG. 1C can be formed. The second epitaxial growth process 104 continues with the first epitaxial growth process 102, but has a higher temperature for epitaxial growth. The thickness of the second epitaxial growth process 104 substantially ranges between 0.5 μm and 1 μm, and preferably is equivalent to 0.8 μm.

During the second epitaxial growth process 104, the compound semiconductor material formed by epitaxy does not completely fill up the recess 103*b*, but is randomly inserted into the recess 103*b* formed in the first compound semiconductor epitaxial layer 103, whereby a plurality of irregularly arranged recesses 103*b*' (gaps) are gradually formed. The second compound semiconductor epitaxial layer 105 covers the recess 103*b*' and directly contacts the top 103*c* of the hexagonal conical island structure 103*a* of the first compound semiconductor epitaxial layer 103, and an epitaxial interface 106 is formed between the second compound semiconductor epitaxial layer 105 and the first compound semiconductor epitaxial layer 103. In details, the epitaxial interface 106 is disposed on one side of the first compound semiconductor epitaxial layer 103 opposite to the side of the first compound semiconductor epitaxial layer facing the top surface 101c of the substrate 101. Besides, the top surface 101c of the substrate 101 and the bottom of the recess 103b' are separated by a distance D substantially ranging between 0.8 μm and 1.3 μm.

In the present embodiment, the top 103c of each island structure 103a of the first compound semiconductor epitaxial layer 103 has a surface substantially parallel to a c-plane direction of the AlN epitaxial layer and can provide a substantially flat surface allowing the second epitaxial growth process 104a performed thereon. Furthermore, the recess 103b' can block the lattice defects extending upwards in the epitaxy growth process, and therefore reduce the dislocation density of the second compound semiconductor epitaxial layer 105 and increase the quality of the compound semiconductor film structure 100.

In some embodiments of the present disclosure, the first epitaxial growth process 102 and the second epitaxial growth process 104 can be performed in the same reaction chamber to form a self-assembled compound semiconductor film structure 100 in situ, additional etching process used to form regular holes or protrusions on the substrate required by the ELO technology is no more necessary, such that the objects of simplifying the manufacturing process and reducing the manufacturing cost can be achieved.

According to the above embodiment of the present disclosure, a compound semiconductor film structure is provided. A first compound semiconductor film whose thickness substantially ranges between 1 μm and 1.5 μm is formed on a top surface of a substrate by an epitaxial growth technology, wherein the compound semiconductor film has a plurality of regularly arranged island structures separated by a plurality of recesses. Then, a second compound semiconductor film is formed on the island structures and covers the recess to form a compound semiconductor film structure having a plurality of irregularly arranged gaps (recesses), wherein the top surface of the substrate and the bottom of the recesses are separated by a distance substantially ranging between 0.8 μm and 1.3 μm.

Because the gaps (recesses) can block the lattice defects extending upwards in the epitaxy process, the dislocation density of the second compound semiconductor epitaxial layer thus can be reduced and the quality of the compound semiconductor film structure can be improved. In addition, a self-assembled compound semiconductor film structure can be formed on the substrate by merely using an epitaxial growth process, additional etching process used to form regular holes or protrusions on the substrate required by the ELO technology can be omitted, the process for fabricating the compound semiconductor film structure can be simplified and the manufacturing cost can be reduced accordingly.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A compound semiconductor film structure, comprising:
   a substrate having a top surface without patterned holes or protrusions;
   a first compound semiconductor epitaxial layer formed on the top surface, wherein an epitaxial interface is disposed one side of the first compound semiconductor epitaxial layer opposite to one side of the first compound semiconductor epitaxial layer facing the top surface, and at least one recess is formed in the first compound semiconductor epitaxial layer; and
   a second compound semiconductor epitaxial layer formed on the epitaxial interface to cover the at least one recess but not completely fill up the at least one recess;
   wherein the top surface and a bottom of the recess are separated by a distance substantially ranging between 0.8 and 1.3 micrometers (μm).

2. The compound semiconductor film structure according to claim 1, wherein the recess has a cross-sectional profile which is wider at the top but narrower at the bottom.

3. The compound semiconductor film structure according to claim 1, wherein the first compound semiconductor epitaxial layer further has a plurality of irregularly arranged recesses.

4. The compound semiconductor film structure according to claim 1, wherein the first compound semiconductor epitaxial layer and the second compound semiconductor epitaxial layer both comprise an aluminum containing semiconductor material.

5. The compound semiconductor film structure according to claim 4, wherein the aluminum containing semiconductor material is selected from a group consisting of aluminum nitride (AlN), aluminum gallium nitride (AlGaN), aluminum indium gallium nitride (AlInGaN) and arbitrary combinations thereof.

6. The compound semiconductor film structure according to claim 1, wherein the substrate is an AlN precursor layer disposed on a base board.

7. The compound semiconductor film structure according to claim 1, wherein the first compound semiconductor epitaxial layer has a thickness substantially ranging between 1 μm and 1.5 μm.

8. The compound semiconductor film structure according to claim 1, wherein the first compound semiconductor epitaxial layer has a honeycomb shaped profile in a plan view.

9. The compound semiconductor film structure according to claim 1, wherein the first compound semiconductor epitaxial layer has a plurality of irregularly arranged island structures, and each of the island structures has a diameter substantially ranging between 2 μm and 4 μm.

10. The compound semiconductor film structure according to claim 1, wherein the recess has an opening width substantially ranging between 0.1 μm and 0.5 μm.

11. A compound semiconductor film structure, comprising:
   a substrate having a top surface;
   a first compound semiconductor epitaxial layer formed on the top surface, wherein an epitaxial interface is disposed one side of the first compound semiconductor epitaxial layer opposite to one side of the first compound semiconductor epitaxial layer facing the top surface, and at least one recess is formed in the first compound semiconductor epitaxial layer; and
   a second compound semiconductor epitaxial layer formed on the epitaxial interface to cover the at least one recess but not completely fill up the at least one recess;
   wherein the top surface and a bottom of the recess are separated by a distance substantially ranging between 0.8 and 1.3 micrometers (μm); the first compound semiconductor epitaxial layer and the second compound semiconductor epitaxial layer are formed in situ.

* * * * *